(12) United States Patent
Schulmann et al.

(10) Patent No.: US 6,758,901 B2
(45) Date of Patent: Jul. 6, 2004

(54) CRYSTAL SUPPORT

(75) Inventors: Winfried Schulmann, Kleinostheim (DE); Helmut Kaiser, Bruchköbel (DE)

(73) Assignee: Crystal Growing Systems GmbH, Hanau (DE)

(*) Notice: Subject to any disclaimer, the term of this patent is extended or adjusted under 35 U.S.C. 154(b) by 0 days.

(21) Appl. No.: 10/095,853

(22) Filed: Mar. 11, 2002

(65) Prior Publication Data

US 2002/0124795 A1 Sep. 12, 2002

(51) Int. Cl.[7] ............... C30B 15/32; C30B 15/00
(52) U.S. Cl. ............... 117/200; 117/206; 117/208; 117/218; 117/911
(58) Field of Search .................. 117/200, 206, 117/208, 218, 911

(56) References Cited

U.S. PATENT DOCUMENTS

| | | | |
|---|---|---|---|
| 4,973,518 A | | 11/1990 | Kida et al. |
| 5,126,113 A | * | 6/1992 | Yamagishi et al. .......... 117/218 |
| 5,932,007 A | * | 8/1999 | Li .............................. 117/208 |
| 5,938,843 A | * | 8/1999 | Hiraishi et al. ............. 117/218 |
| 6,063,189 A | * | 5/2000 | Hiraishi ....................... 117/218 |
| 6,139,633 A | * | 10/2000 | Nishiura ....................... 117/208 |
| 6,228,167 B1 | * | 5/2001 | Kuramoto et al. .......... 117/208 |
| 6,315,827 B1 | * | 11/2001 | Kurosaka et al. ........... 117/208 |

FOREIGN PATENT DOCUMENTS

| | | | |
|---|---|---|---|
| DE | 197 37 605 A1 | 3/1999 | |
| WO | WO 9915717 A1 * | 4/1999 | ........... C30B/15/30 |

* cited by examiner

Primary Examiner—Nadine G. Norton
Assistant Examiner—Matthew J Song
(74) Attorney, Agent, or Firm—Needle & Rosenberg, P.C.

(57) ABSTRACT

The invention relates to a method and to a device for supporting a crystal ingot while pulling a single crystal, in particular such a crystal composed of silicon, according to the Czochralski method. To this end, a crystal support is provided which engages with a specialized bead, which is formed on the neck of the single crystal ingot and which has the shape of a bicone, by means of bearings in a housing. A support of the crystal ingot is thus achieved which may be disengaged at any time, and which has no disruptive effects on crystal growth and which acts independently of the length of the grown crystal. The bearings are moved into the support position on the bicone by a central pulling element which can be independently displaced relative to a second pulling element.

14 Claims, 3 Drawing Sheets

CRYSTAL SUPPORT

This application claims priority to German Patent Application No. 101 11 953.4 filed on Mar. 12, 2001, which application is incorporated herein in its entirety.

BACKGROUND OF THE INVENTION

1. Field of the Invention

The invention relates to a method and to a device for removing the load from a seed crystal during pulling according to the Czochralski method, more particularly to a method and device for support a crystal ingot while pulling a single crystal according to the Czochralski method.

2. Background Art

Typically, in the actual pulling process utilizing the Czochralski method, a neck with a sharply tapered cross section is first grown in order to minimize to the utmost extent structural defects such as subgrain boundaries or dislocations arising from melting or imparted by the seed crystal, by a type of "outgrowth" from the neck of the growing crystal.

The growth is then regulated so that a conical section is followed by a cylindrical section with a much larger, essentially uniform diameter, followed at the end by another conical section. Only the cylindrical section is typically of interest for use in the electronics industry, for example. There is a user demand for ever-larger diameters and, thus, for substances from these cylindrical sections (with diameters of 300–400 mm and greater and weights of 250–400 kg and greater).

The technical and technological problem lies in the fact that the neck, which is kept very thin by growing techniques, cannot bear these tensile loads. A further problem lies in the fact that in certain cases at least partial remelting of the newly grown crystal must be performed, thus creating the need for a support solution by internally releasing the support on the crystal neck at any time. The process for supporting the crystal neck must proceed very slowly and controllably during transmission of the load from the neck to the support device. This is because no particles of any type, such as from abrasion, can be allowed in the melt since such contaminants would disrupt crystal formation as well as the solidification process at the melt front. In addition, transmission of the load must have absolutely no influence on the actual pulling speed, or else uncontrolled crystal growth would ensue.

In U.S. Pat. No. 4,973,518 it has been noted that during pulling of a single crystal, the thin neck can be subjected to an axial load, but that any transverse forces must be avoided since the slightest lateral stress can break off the neck. In order to avoid this hazard, it was proposed to expand the thin neck in the axial direction at a specified position so as to form a bead to bear the load, with a bearing device resting on said bead. A similar design is proposed in U.S. Pat. No. 5,126,113, but here it is not possible to disengage the bearing for the single crystal, thus leaving the problem of remelting unsolved.

Another fundamental principle of crystal support during the pulling process is proposed in German Patent Application 197 37 605 A1, whereby a permanent adhesive bond is created between the conical section of the crystal ingot at the beginning of the single crystal and a specially designed support element. Although this solves the problem of transmitting force to a specialized pulling device from the single crystal to be grown, whereby the thin neck is relieved of tensile stress during the pulling process, this bond cannot be released at will and remelting is therefore not possible.

SUMMARY

The present invention relates to a method and to a device for supporting a crystal ingot while pulling a single crystal according to the Czochralski method. To this end, a crystal support is provided which engages with a specialized bead, which is formed on the neck of the single crystal ingot and which preferably has the shape of a bicone, by means of bearings mounted in a housing. The housing is connected to a second pulling element. The bearings within the housing are moved into a support position on the specialized bead by a central pulling element which can be independently displaced relative to the second pulling element. Support of the crystal ingot is thus achieved which may be disengaged at any time, and which has no disruptive effects on crystal growth and which acts independently of the length of the grown crystal.

BRIEF DESCRIPTION OF THE DRAWINGS

The accompanying drawings, which are incorporated in and constitute a part of this specification, illustrate several embodiments of the invention and together with the description, serve to explain the principals of the invention.

DETAILED DESCRIPTION OF THE INVENTION

The present invention is more particularly described in the following examples that are intended to be illustrative only since numerous modifications and variations therein will be apparent to those skilled in the art. As used in the specification and in the claims, the singular form "a," "an" and "the" include plural referents unless the context clearly dictates otherwise.

Figure 1:
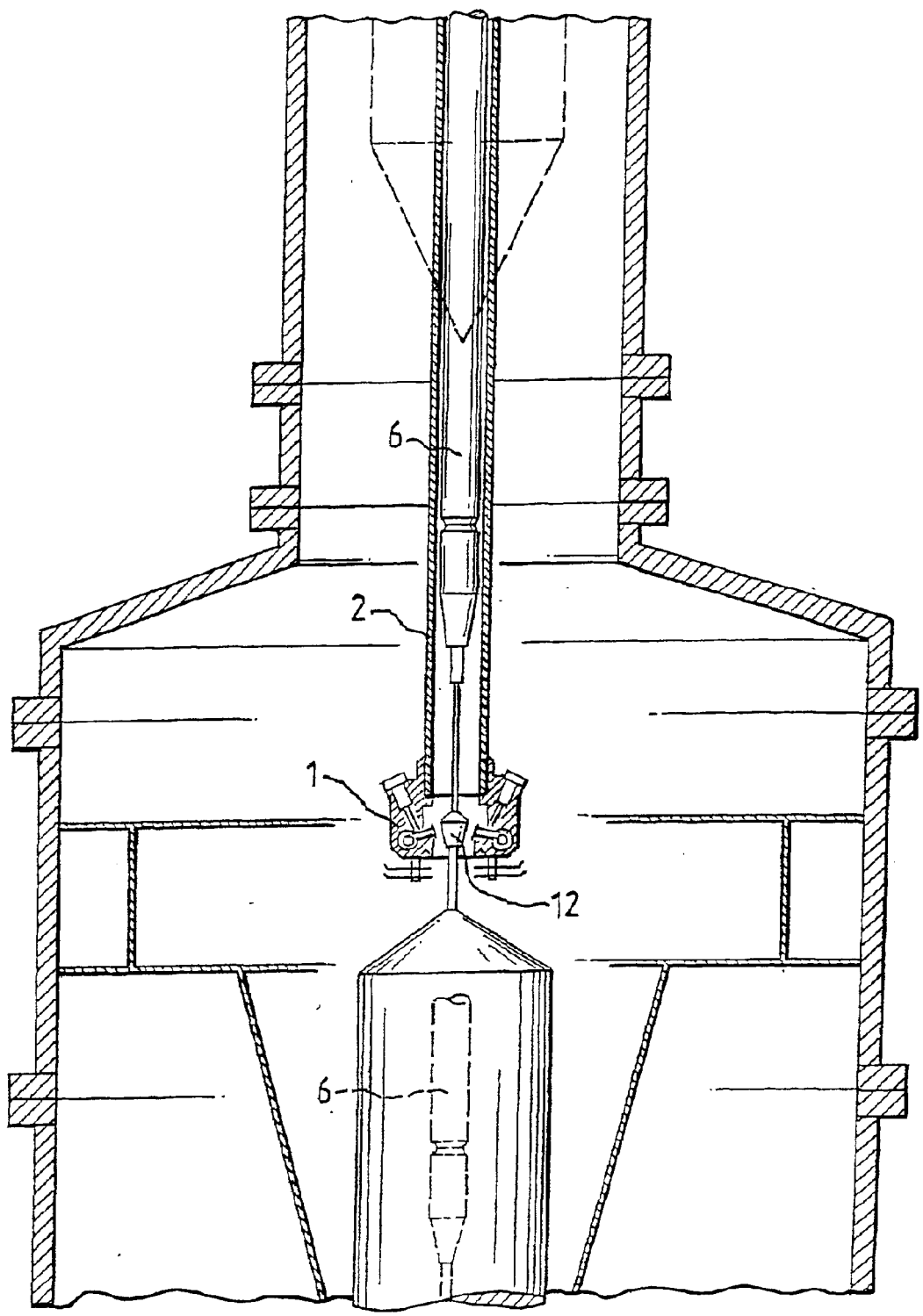
FIG. 1 is a partial cross-sectional view of an embodiment of the crystal support showing a housing connected to a second pulling element and a central pulling element connected to a single crystal being pulled.
Figure 2:
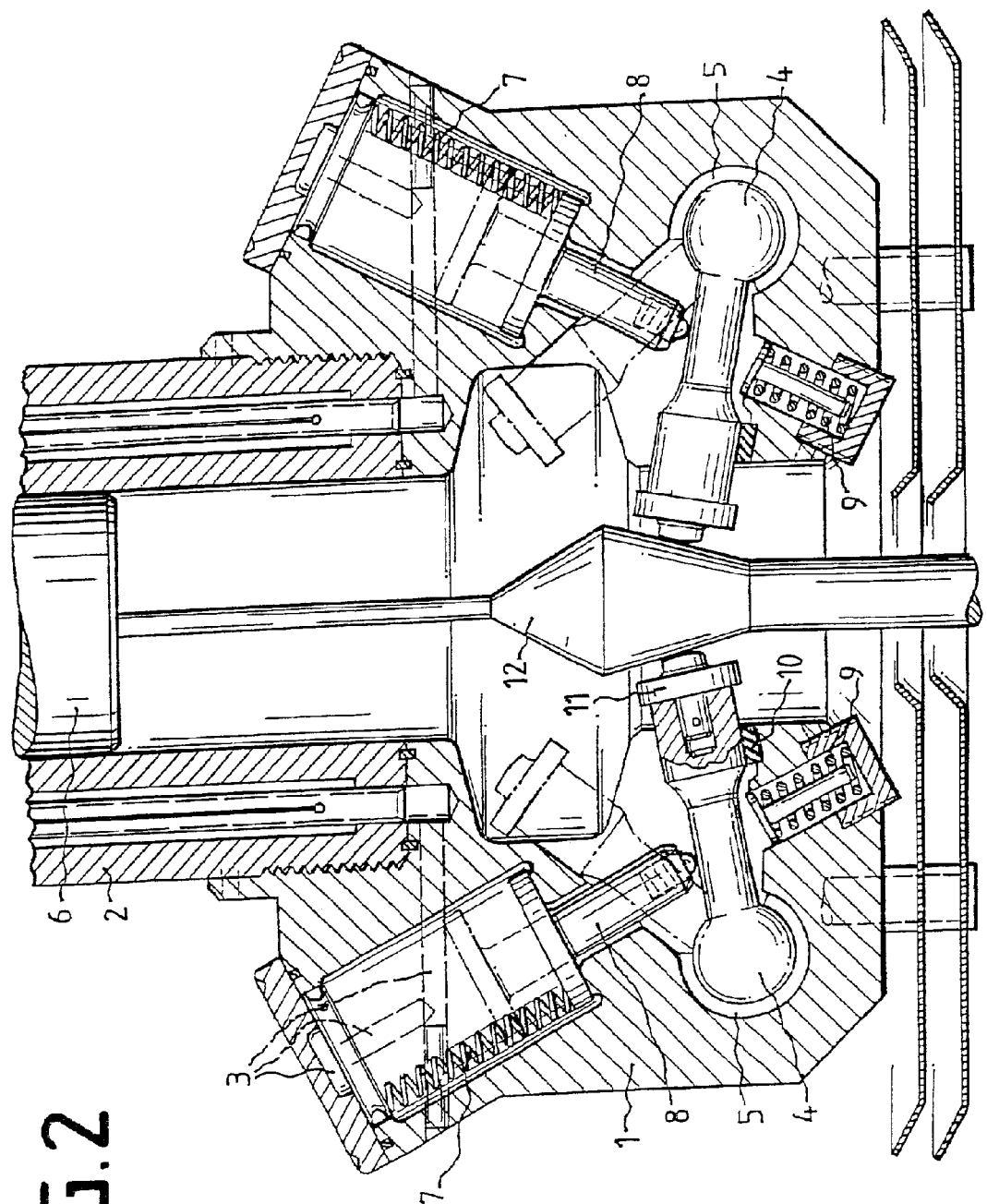
FIG. 2 is a partial cross-sectional view of the crystal support showing a second pulling element connected to a housing, a plurality of bearings pivotally mounted therein the housing and in select contact with a specialized bead on a single crystal being pulled, and a central pulling element connected to the crystal.

The referenced problems are solved and the objects are achieved by the arrangement described hereinafter and by the proposed method according to the invention, in that the crystal support comprises an annular housing 1 which is disposed so as to be displaceable in the axial direction of the single crystal to be grown, and which is connected to the lower section of a second pulling element 2 via a thread and a holding device 3 (FIG. 1 and FIG. 2).

In the annular housing 1 are situated, in a symmetrical arrangement at the same height, at least two, preferably a plurality, of bearings 4 in the form of rotatably mounted levers which are arranged in a bearing support 5 at right angles to the pulling direction of a central pulling element 6. The rotatably mounted levers 4 are moved against a passive control element 9 in the form of a spring or counterweight by an active control element 7, on the front end of which is mounted an actively moved pressure pin 8.

The passive control element 9 also acts to reset the rotatably mounted levers 4 to their starting position. The active control element can be actuated by mechanical, electrical, or hydraulic or pneumatic means, preferably using argon. In the actuated, that is, the tipped-under state, the rotatably mounted levers 4 rest on a counter bearing 10 in the annular housing 1, with the levers advantageously being process-compatible in shape and material and designed to accept loads greater than 500 kg.

At the active front end of the lever 4 is mounted a pressure member 11 which transmits the load on the crystal by the specialized design of its shape (bicone 12) to the second pulling element 2, thereby relieving the load on the thin crystal neck. The pulling element 6 can thus on the one hand be moved (raised, lowered, rotated) synchronously with or by the pulling element 2, and on the other hand can also be moved (raised, lowered) relative to the pulling element 2.

During the actual crystal growing process, in the production of a single crystal an additional so-called bicone 12 is provided in the region of the neck between the seed crystal and the cylindrical crystal ingot. The single crystal which is growing and thus increasing in weight is supported by said bicone. The growing single crystal may then be lifted only when the total weight exceeds the tensile strength of the crystal neck above the bicone 12.

For support by the bicone 12, said bicone is first underpinned by the second pulling element 2. The active control elements 7 are moved, for example against the restoring force of the elasticity in the passive control element 9, until the levers 4 rest on the counter bearing 10.

Lifting of the second pulling element with a greater speed than the pulling speed of the central pulling element 6 brings the pressure member 11 in contact with the bicone 12, thereby progressively transmitting the load to the second pulling element. When this pulling element is relieved of the load on the crystal, which may be technologically dictated for remelting, the central pulling element 6 is then moved relative to the second pulling element 2.

As a result, the rotatably mounted levers 4 are actuated by the spring in the passive control element and return to their starting position, or they are moved by actuation (return motion) of the active control element.

Figure 3:
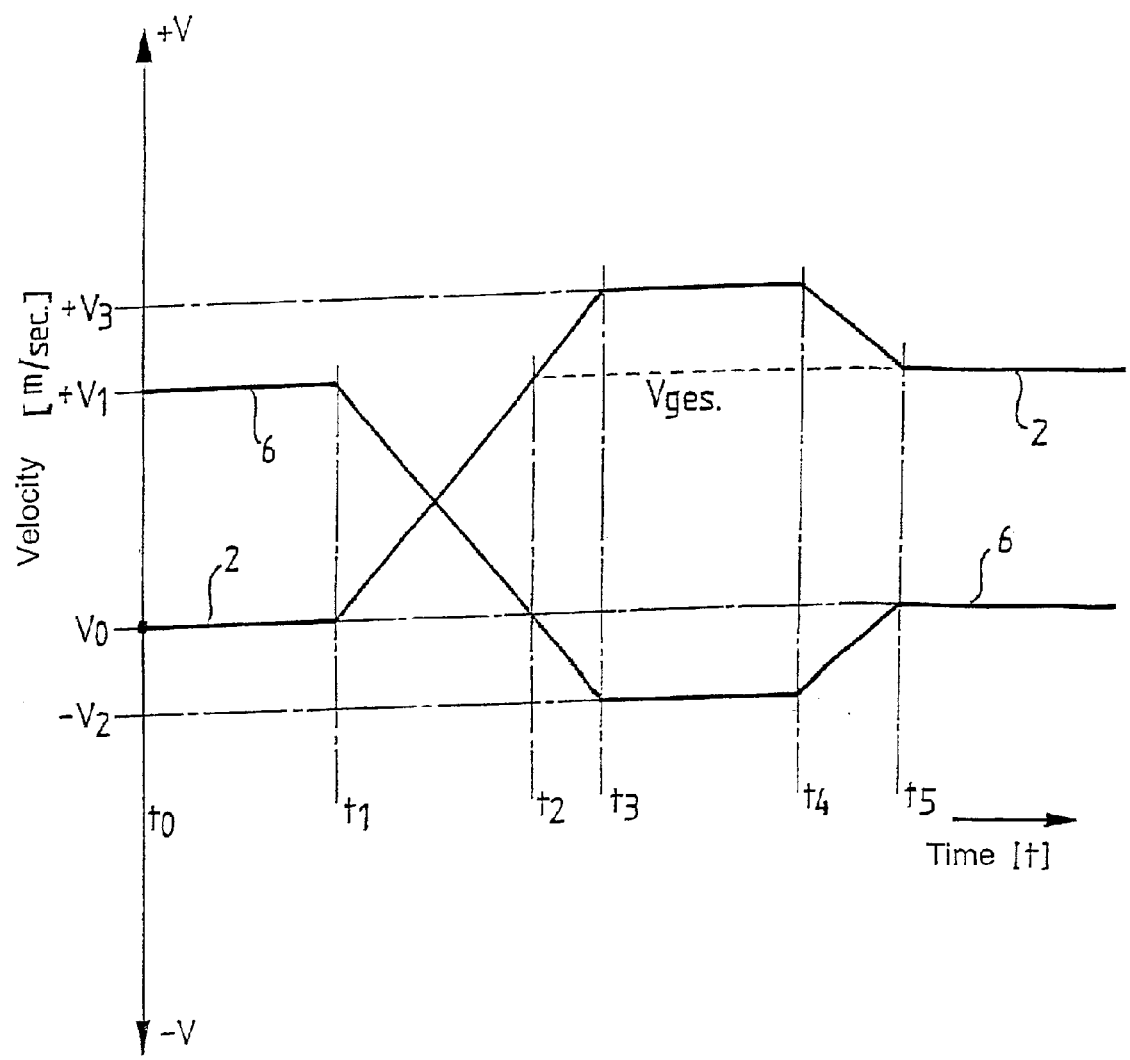
FIG. 3 is a chart showing exemplified relative velocities of a central pulling element and a second pulling element over time which, in turn, illustrates an exemplified course of the control of the crystal support and the transmission of the load from the central pulling element to the second pulling element.

FIG. 3 shows the course of the control of crystal support and the transmission of load from the central pulling element to the second pulling element.

At time $t_0$ the central pulling element lifts with a velocity $v_1$, and the second pulling element lifts with a velocity of 0 mm/min. After time $t_1$ the lifting velocity of the central pulling element is steadily decreased by x mm/min until reaching 0 mm/min, while at the same time the lifting velocity of the second pulling element is synchronously increased by x mm/min until reaching $v_1$, so that the velocity $v_{res}$ resulting from both lifting motions remains constant. After $t_2$, the lifting direction of the central pulling element is reversed, resulting in lowering, and after $t_3$ the central pulling element is moved at a constant velocity $-v_2$ while the second pulling element is moved at a constant velocity $v_3=v_{res}+v_2$. When the pressure elements make contact with the bicone at time $t_4$, the pulling speed of the central [pulling] element is reduced by y mm/min until reaching 0 mm/min, and the pulling speed of the second pulling element is returned to $v_1=v_{res}$, until at time $t_5$ the process of load transmission is concluded.

The time $t_1$ is defined by the user, while the rise in the opposing relative motions of the two pulling elements is specified by the method and process parameters (the manipulated variable of the particular process formulation). Time $t_2$ results mathematically from the referenced rises, and time $t_3$ results from the defined velocity $-v_2$. Time $t_4$ is specified by a trigger point of the weight sensor, and the subsequent return of the central pulling element to 0 mm/min and of the second pulling element to $v_{res}$ at time $t_5$ is in turn specified by the defined rise in the change in lifting velocities.

For load transmission between times $t_1$ and $t_5$ in the crystal pulling process according to the Czochralski method, the absolute lifting velocity $v_{res}$ for the grown crystal—which results from closed loop control with the crystal diameter as the manipulated variable and from the above-referenced open loop control with fixed values in the form of process parameters that serve to control the motions of both pulling elements relative to one another—is achieved by an overlapping of two motions. These motions compensate for one another, and the initial function of the central pulling element as a master reverses to a slave function during this time period.

The load distribution on both pulling elements may be regulated by appropriate positioning of the two pulling elements with respect to one another, and is controlled by a measured variable which is specified by the weight of the crystal, using a weight sensor, for the load on the central pulling element.

Compared to conventional designs, this type of crystal support during the growing process has the advantage that, as a result of the relative motion of the two pulling elements, support can be provided for any desired crystal length, and in comparison to a fixed bearing for crystal support this is achieved independent of the crystal geometry. Because the support process is reversible, all process-related operations in the technologically dictated remelting of the crystal are easier to perform, since the crystal support is not irreversible and there is no permanent connection between the crystal and the support device. The load distribution between the two pulling elements, which can be displaceably arranged with respect to one another, can be easily achieved by measuring the weight of the growing crystal.

The invention has been described herein in detail, in order to comply with the Patent Statutes and to provide those skilled in the art with information needed to apply the novel principles, and to construct and use such specialized components as are required. However, it is to be understood, by those skilled in the art, that the invention can be carried out by specifically different equipment and devices, and that various modifications, both as to equipment details and operating procedures can be affected without departing from the scope of the invention itself. Further, it should be understood that, although the present invention has been described with reference to specific details of certain embodiments thereof, it is not intended that such details should be regarded as limitations upon the scope of the invention except as and to the extent that they are included in the accompanying claims.

What is claimed is:

1. A crystal support for supporting a crystal ingot while pulling a single crystal according to the Czochralski method, the crystal support comprising: a central pulling element; a second pulling element having an upper end and a lower end, the second pulling element displaceably mounted with respect to the central pulling element and having a longitudinal upright axis; and at least two rotatably mounted bearings situated at the same height relative to the second pulling element, the rotatable bearings symmetrically connected to the lower end of the second pulling element, each rotatable bearing having a first end, wherein the rotatable bearings can be moved against a passive control element by an active control element, wherein the at least two rotatably mounted bearings are selectively movable between a starting position, in which a portion of the passive control element is in urging contact with a portion of the rotatable bearing such that the first end of the rotatable bearing is rotated upwards towards the upper end of the second pulling element and away from the longitudinal upright axis of the second pulling element, and a support position, in which a portion of the active control element is in urging contact with a portion of the rotatable bearing such that the rotatable bearing is rotated away from the upper end of the second pulling element and toward the longitudinal upright axis of the second pulling element, and wherein the second pulling element is movable relative to the central pulling element such that second pulling element is spaced from the central pulling element and the at least two rotatably mounted bearings are selectively moved from the support position to the starting position.

2. The crystal support of claim 1, wherein the central pulling element may be moved synchronously with the second pulling element, and that both of the central and second pulling elements can be moved with respect to one another in an axial direction.

3. The crystal support of claim 1, further comprising means for actuating the active control element.

4. The crystal support of claim 1, wherein the passive control element has means for resetting the rotatable bearings to the starting position.

5. The crystal support of claim 1, further comprising a counter bearing, and wherein the rotatable bearings rest on the counter bearing in the support position.

6. The crystal support of claim 5, wherein the rotatable bearings are process-compatible in shape and material.

7. The crystal support of claim 5, wherein the central pulling element and the second pulling element can each support loads greater than 500 kg.

8. The crystal support of claim 5, further comprising a bead formed on a portion of the crystal ingot, wherein a portion of the rotatable bearings are in contact with a portion of the bead when the rotatable bearings are in the support position, and wherein the bead has a bicone shape.

9. A crystal support for supporting a crystal ingot while pulling a single crystal according to the Czochralski method, the ingot having a neck portion and a bead formed on a portion of the ingot, the bead having a bicone shape, the crystal support comprising:
 a central pulling element displaceable in an axial direction, the central pulling element detachable engaged to the neck portion of the ingot;
 a second pulling element having a distal end and defining a bore having a first longitudinal axis that extends in the axial direction, the second pulling element displaceable in the axial direction, wherein the central pulling element is sized and shaped so that it may be drawn therein the bore of the second pulling element, and wherein the second pulling element and the central pulling element are displaceable relative to each other along the axial direction;
 a housing having a top end, an opposing bottom end, and defining a cavity extending therein from the top end to the bottom end, the cavity having a central longitudinal axis, the second pulling element connected to the top end of the housing so that the bore of the second pulling element is in communication with the cavity of the housing and so that the longitudinal axis of the cavity of the housing and the bore of the second pulling element are substantially co-axial, wherein the housing has a plurality of bearing supports symmetrically disposed in the cavity of the housing;
 a plurality of rotatable bearings rotatably mounted therein the cavity of the housing, wherein each rotatable bearing has a first end and a second end, the second end of each rotatable bearing being mounted into one bearing support;
 a plurality of passive control elements, each passive control element mounted in the cavity of the housing intermediate one bearing support and the cavity and proximate the bottom end of the housing, each passive control element in select contact with one rotatable bearing;
 a plurality of active control elements, each active control element mounted in the cavity of the housing intermediate one bearing support and the cavity and proximate the top end of the housing, each active control element in select contact with one rotatable bearing; and
 a means for resetting each rotatable bearing to a starting position in which the passive control element is in a first extended position and the active control element is in a deactuated state and in a first withdrawn position such that the rotatable bearing is rotated against the active control element by the passive control element and away from the central longitudinal axis of the cavity of the housing,
 and wherein each rotatable bearing is selectively movable between the starting position, in which a portion of the passive control element is in urging contact with a portion of the rotatable bearing such that the first end of the rotatable bearing is rotated upwards towards the top end of the housing, and a support position, in which a portion of the active control element is in urging contact with a portion of the rotatable bearing such that the rotatable bearing is rotated away from the top end of the housing and toward from the central longitudinal axis of the cavity of the housing.

10. The crystal support of claim 9, wherein one active control element opposes one passive control element to form an opposing pair of control elements, and wherein the pair of control elements are substantially co-axial to each other.

11. The crystal support of claim 9, wherein the passive control element is selected from a group consisting of a spring or a counterweight.

12. The crystal support of claim 9, further comprising means for actuating the active control element to move the rotatable bearing against the passive control element.

13. The crystal support of claim 9, further comprising means for moving the rotatable bearing to the support position in which the passive control element is in a second withdrawn position and the active control element is in an actuated state and in a second extended position such that the bearing is rotated against the passive control element by the active control element and toward the central longitudinal axis of the cavity of the housing so that a portion of the first end of the bearing is placed into supportive contact with a portion of the bead formed on the ingot.

14. The crystal support of claim 13, wherein that housing includes a plurality of counter bearings positioned within the cavity of the housing, and wherein a portion of the rotatable bearing proximate the first end of the rotatable bearing rests on the counter bearing when the rotatable bearing is in the support position.

* * * * *